(12) United States Patent
Tsai et al.

(10) Patent No.: US 12,255,638 B2
(45) Date of Patent: Mar. 18, 2025

(54) ELECTRICAL APPARATUS

(71) Applicant: Innolux Corporation, Miaoli County (TW)

(72) Inventors: Hsiu-Yi Tsai, Miaoli County (TW); Yu-Ti Huang, Miaoli County (TW); Yu-Hsiang Chiu, Miaoli County (TW); Yi-Hung Lin, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 18/161,899

(22) Filed: Jan. 31, 2023

(65) Prior Publication Data

US 2023/0261650 A1    Aug. 17, 2023

Related U.S. Application Data

(60) Provisional application No. 63/311,046, filed on Feb. 17, 2022.

(30) Foreign Application Priority Data

Nov. 1, 2022   (CN) .......................... 202211356110.2

(51) Int. Cl.
*H03K 17/56* (2006.01)
(52) U.S. Cl.
CPC .................. *H03K 17/56* (2013.01)
(58) Field of Classification Search
CPC .... H03K 17/735; H03K 17/56; H03K 17/002; H03K 17/693; G09G 2300/0408; G09G 2310/0267
See application file for complete search history.

(56) References Cited

U.S. PATENT DOCUMENTS

| | | | |
|---|---|---|---|
| 9,502,586 B1* | 11/2016 | Kim | H01L 29/66181 |
| 2013/0181968 A1* | 7/2013 | Uemura | G02B 30/31 |
| | | | 345/212 |
| 2014/0210875 A1* | 7/2014 | Sumi | H04N 13/305 |
| | | | 345/697 |
| 2016/0055818 A1* | 2/2016 | Kim | G11C 19/287 |
| | | | 345/95 |
| 2017/0039976 A1* | 2/2017 | Miyake | G09G 3/3648 |
| 2019/0114980 A1* | 4/2019 | Kim | G02F 1/136213 |
| 2020/0105176 A1 | 4/2020 | Kurokawa et al. | |
| 2022/0165209 A1* | 5/2022 | Choi | G09G 3/3233 |

FOREIGN PATENT DOCUMENTS

| | | |
|---|---|---|
| CN | 102934423 | 2/2013 |
| TW | 202211187 | 3/2022 |

OTHER PUBLICATIONS

"Search Report of Europe Counterpart Application", issued on Jul. 10, 2023, p. 1-p. 7.

* cited by examiner

*Primary Examiner* — Quan Tra
(74) *Attorney, Agent, or Firm* — JCIPRNET

(57) ABSTRACT

The disclosure provides an electrical apparatus, including a substrate, a plurality of gate driver units and a plurality of gate lines. The gate driver units are disposed on the substrate. The gate lines are disposed on the substrate. Each of the gate lines is respectively electrically connected to the corresponding gate driver unit. Each of the gate lines is configured to transmit a respective gate signal. The gate lines include a first gate line and a second gate line. The first gate line and the second gate line are configured to transmit the respective gate signals at a same time.

18 Claims, 9 Drawing Sheets

ELECTRICAL APPARATUS

CROSS-REFERENCE TO RELATED APPLICATION

This application claims the priority benefit of U.S. provisional application Ser. No. 63/311,046, filed on Feb. 17, 2022 and China application serial no. 202211356110.2, filed on Nov. 1, 2022. The entirety of each of the above-mentioned patent applications is hereby incorporated by reference herein and made a part of this specification.

BACKGROUND

Technical Field

The disclosure relates to an electrical apparatus, and in particular relates to an electrical apparatus having a gate driver unit.

Description of Related Art

Current electronic apparatuses may integrate antenna substrates to send and receive electromagnetic wave signals. The antenna substrate includes multiple antenna units. The conduction state of the antenna unit may be controlled with a thin film transistor element. Generally, the additionally manufactured source driver chip and gate driver chip are disposed on the peripheral region of the antenna substrate by chip bonding, so as to control the antenna unit to send and receive electromagnetic wave signals. The greater the number of antenna units, the greater the bandwidth that may be received, but the more chips are required. Both the cost and yield of electronic apparatuses are affected.

SUMMARY

The disclosure provides an electronic apparatus having a gate driver unit, which may reduce the cost and improve the yield.

The disclosure provides an electronic apparatus, including a substrate, multiple gate driver units, and multiple gate lines. The gate driver units are disposed on the substrate. The gate lines are disposed on the substrate. Each of the gate lines is respectively electrically connected to the corresponding gate driver unit. Each of the gate lines is configured to transmit a respective gate signal. The gate lines include a first gate line and a second gate line. The first gate line and the second gate line are configured to transmit the respective gate signals at a same time.

In an embodiment of this disclosure, the first gate line and the second gate line are not adjacent.

In an embodiment of this disclosure, the electronic apparatus further includes multiple electronic units. The electronic units are disposed on the substrate. Each of the electronic units is respectively electrically connected to the corresponding gate driver unit through the corresponding gate line. Each of the gate driver units is configured to control the corresponding electronic unit.

In the embodiments of this disclosure, each of the electronic units is a varactor unit.

In an embodiment of this disclosure, the electronic units are disposed on an active region of the substrate.

In an embodiment of this disclosure, the gate driver units include a first gate driver unit and a second gate driver unit. The first gate driver unit is electrically connected to the first gate line. The second gate driver unit is electrically connected to the second gate line. The first gate driver unit and the second gate driver unit are configured to receive a start signal.

In an embodiment of this disclosure, the gate driver units are divided into multiple groups. The first gate driver unit and the second gate driver unit are first gate driver units of different groups.

In an embodiment of this disclosure, the first gate driver unit and the second gate driver unit are configured to receive a first clock signal.

In an embodiment of this disclosure, the first gate driver unit is configured to receive a first clock signal. The second gate driver unit is configured to receive a second clock signal.

In an embodiment of this disclosure, the electronic apparatus further includes a synchronization circuit. The synchronization circuit is electrically connected to the gate driver units and is configured to output a clock signal.

In order for the foregoing content to be understood easier, several embodiments with accompanying drawings are described in detail as follows.

DETAILED DESCRIPTION OF DISCLOSED EMBODIMENTS

Figure 1:
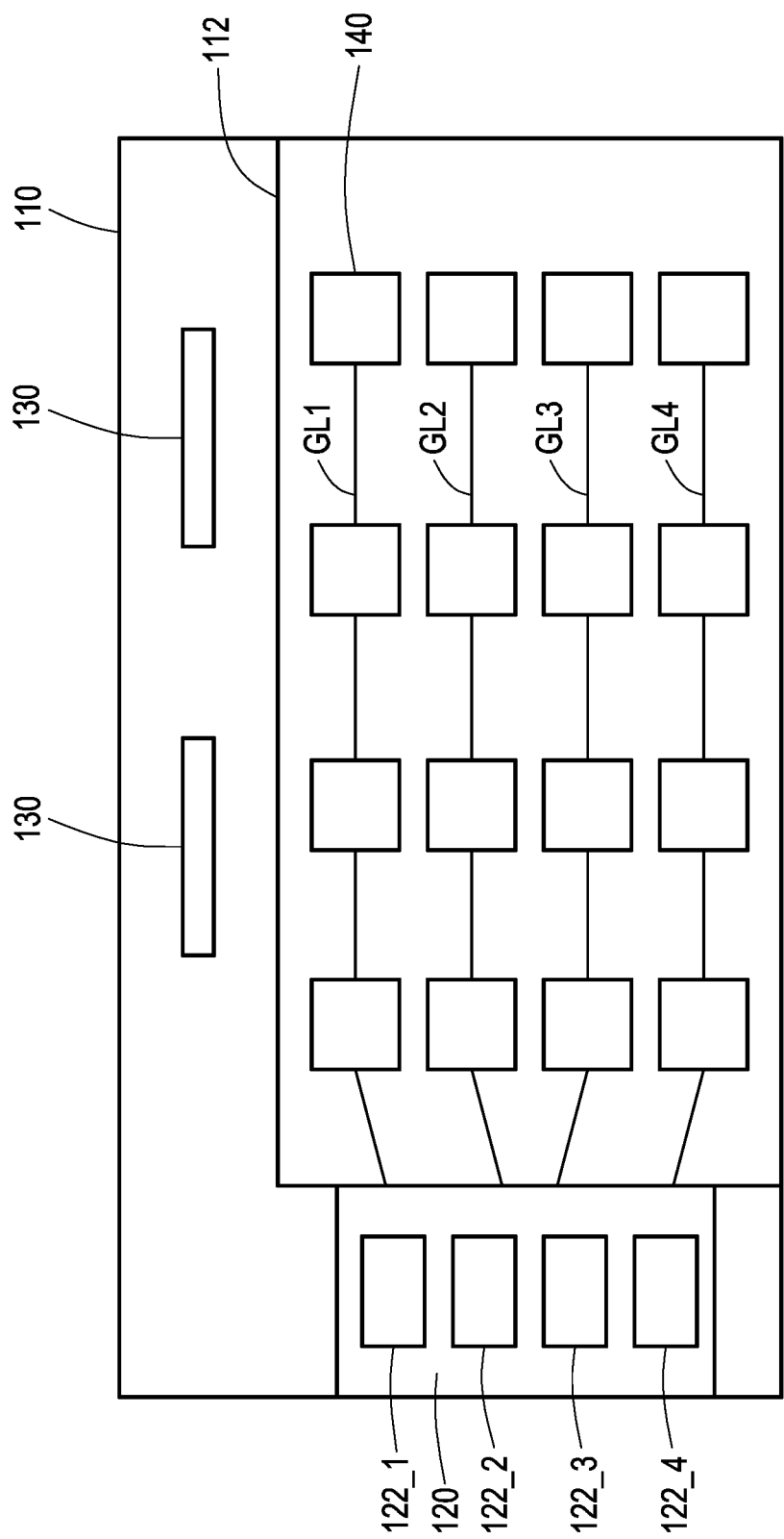
FIG. 1 is a schematic diagram of an electronic apparatus according to an embodiment of this disclosure.

The disclosure may be understood by referring to the following detailed description in conjunction with the accompanying drawings. It should be noted that, for the ease of understanding by the readers and for the brevity of the accompanying drawings, multiple drawings in the disclosure only depict a portion of the electronic device, and the specific elements in the drawings are not drawn according to the actual scale. In addition, the number and size of each of the elements in the figures are for illustration purposes only, and are not intended to limit the scope of the disclosure.

In the following description and patent claims, words such as "comprising" and "including" are open-ended words, so they should be interpreted as meaning "including but not limited to . . . ".

It should be understood that although the terms "first", "second", "third", . . . may be used to describe various constituent elements, the constituent elements are not limited by the terms. The terms are only used to distinguish a single constituent element from other constituent elements in the specification. The same terms may not be used in the claim, but replaced by first, second, third . . . according to the order in which the elements are declared in the claim. Therefore, in the following description, the first constituent element may be the second constituent element in the claim.

In some embodiments of the disclosure, terms related to joining and connecting, such as "connected", "interconnected", etc., unless otherwise defined, may mean that two structures are in direct contact, or may also mean that two structures are not in direct contact, in which there are other structures located between these two structures. The terms related to joining and connecting may also include the case where both structures are movable, or both structures are fixed. Furthermore, the term "coupled" includes any direct and indirect means of electrical connection.

The electronic apparatus of this disclosure may include a display apparatus, an antenna apparatus, a sensing apparatus, a light emitting apparatus, or a splicing apparatus, but is not limited thereto. The electronic apparatus may include a bendable or flexible electronic apparatus. The electronic apparatus may include electronic elements. The electronic apparatus includes, for example, a liquid crystal layer or a light emitting diode (LED). The electronic elements may include passive elements and active elements, such as capacitors, resistors, inductors, variable capacitors, filters, diodes, transistors, sensors, MEMS, liquid crystal chips, controllers, etc., but not limited thereto. The diode may include a light emitting diode or a photodiode. The light emitting diode may include, for example, an organic light-emitting diode (OLED), a mini light-emitting diode (mini LED), a micro light-emitting diode (micro LED), a quantum dot light-emitting diode (quantum dot LED), fluorescence, phosphor, or other suitable materials, or a combination thereof, but not limited thereto. The sensor may, for example, include capacitive sensors, optical sensors, electromagnetic sensors, fingerprint sensors (FPS), touch sensors, antennas, or pen sensors, etc., but not limited thereto. The controller may include, for example, a timing controller, etc., but is not limited thereto. Hereinafter, an electronic device is used to illustrate the disclosure, but the disclosure is not limited thereto.

References of the exemplary embodiments of the disclosure are to be made in detail. Examples of the exemplary embodiments are illustrated in the drawings. If applicable, the same reference numerals in the drawings and the descriptions indicate the same or similar parts.

Figure 2:
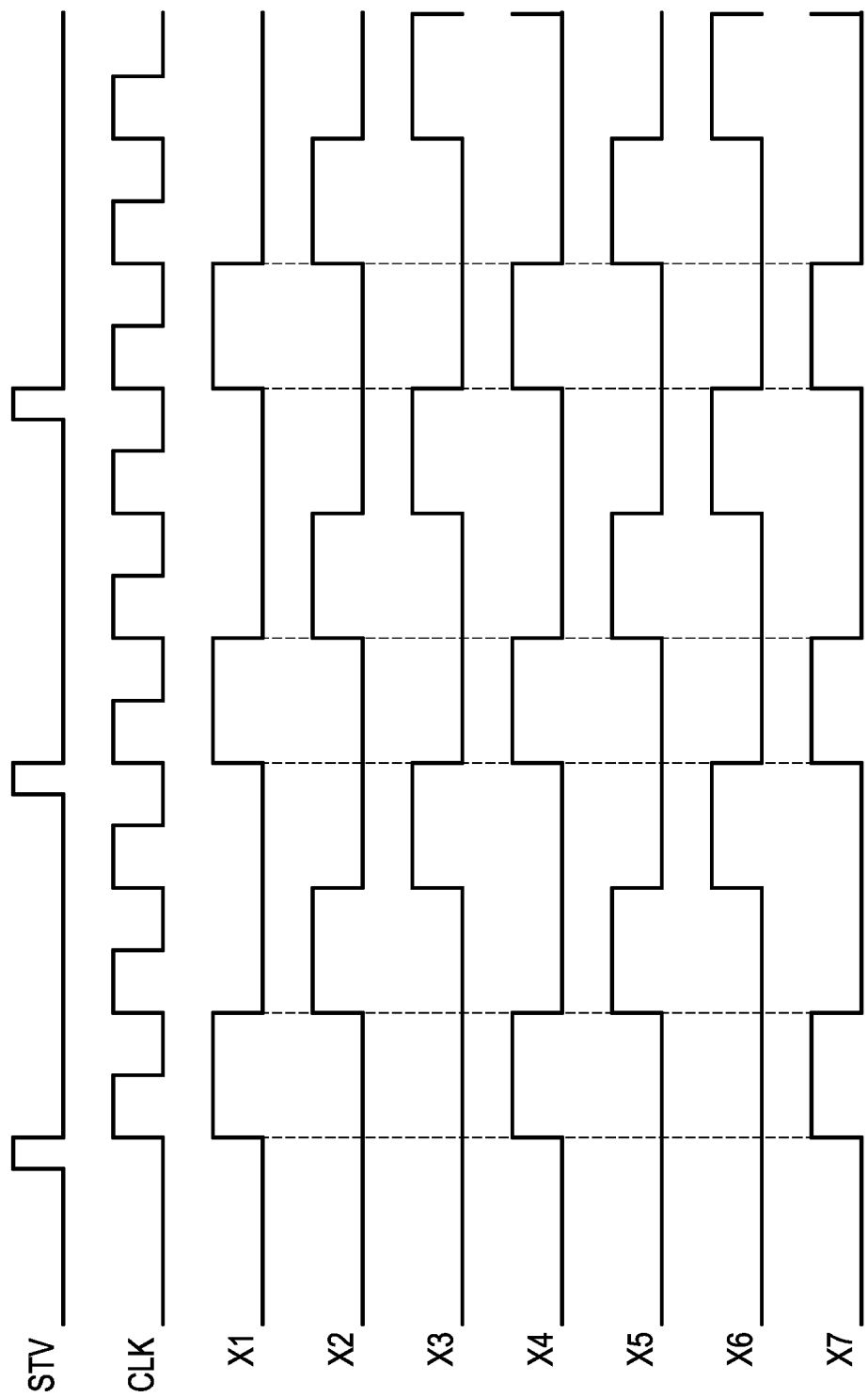
FIG. 2 is a schematic diagram of operating signals of the electronic apparatus in the embodiment of FIG. 1.

FIG. 1 is a schematic diagram of an electronic apparatus according to an embodiment of this disclosure. FIG. 2 is a schematic diagram of operating signals of the electronic apparatus in the embodiment of FIG. 1. Referring to FIG. 1 and FIG. 2, the electronic apparatus 100 includes a substrate 110, a gate driver circuit 120, a source driver circuit 130, multiple electronic units 140 and multiple gate lines GL1, GL2, GL3, and GL4. The gate driver circuit 120, the source driver circuit 130, the electronic units 140, and the gate lines GL1, GL2, GL3, and GL4 are disposed on the substrate 110. In FIG. 1 and FIG. 2, the number of each elements and signals does not limit this disclosure. In this disclosure, the gate driver circuit 120 is distributed on one side of the electronic units 140, but not limited thereto. In some embodiments, the gate driver circuit 120 may be, for example, distributed on two sides or more than two sides of the electronic units 140. In some other embodiments, the gate driver circuit 120 and the source driver circuit 130 may be, for example, distributed on one side of the electronic units 140.

The gate driver circuit 120 includes multiple gate driver units 122_1, 122_2, 122_3, and 122_4 disposed on the substrate 110. Each of the gate lines is respectively electrically connected to the corresponding gate driver unit. For example, the gate line GL1 is electrically connected to the gate driver unit 122_1, the gate line GL2 is electrically connected to the gate driver unit 122_2, the gate line GL3 is electrically connected to the gate driver unit 122_3, and the gate line GL4 is electrically connected to the gate driver unit 122_4. The gate driver circuit 120 is, for example, a gate on panel (GOP) circuit. In some embodiments, the gate driver circuit may include a shift register, a level shifter, or other suitable element, or a combination thereof, but not limited thereto.

The operating signals in FIG. 2 include a start signal STV, a reference clock signal CLK, and gate signals X1, X2, X3, X4, X5, X6, and X7. The gate signals X1, X2, X3, X4, X5, X6, and X7 may be, for example, generated according to the reference clock signal CLK. Each of the gate line is configured to transmit a respective gate signal. For example, the gate line GL1 is configured to transmit the signal X1, the gate line GL2 is configured to transmit the gate signal X2, the gate line GL3 is configured to transmit the gate signal X3, and the gate line GL4 is configured to transmit the gate signal X4. The relationship of the rest of the gate lines for transmitting the gate signal may be deduced in the same way.

In this embodiment, the gate signal X1 transmitted on the gate line GL1 (the first gate line) and the gate signal X4 transmitted on the gate line GL4 (the second gate line) have the same time sequence, and the gate line GL1 and the gate line GL4 are not adjacent. That is to say, the gate lines GL1, GL2, GL3, and GL4 include a first gate line GL1 and a second gate line GL4. The first gate line GL1 and the second gate line GL4 are configured to transmit the gate signal X1 and the gate signal X4 at a same time. The gate signal X1 transmitted on the first gate line GL1 and the gate signal X4 transmitted on the second gate line GL4 have the same time sequence. The first gate line GL1 and the second gate line GL4 are not adjacent.

Each of the electronic units is respectively electrically connected to the corresponding gate driver unit through the corresponding gate line. Each of the gate driver unit is configured to control the corresponding electronic unit. For example, the electronic units 140 in the first row is electrically connected to the gate driver unit 122_1 through the gate line GL1, and the gate driver unit 122_1 is configured to control the electronic units 140 in the first row. The electronic units 140 in the second row is electrically connected to the gate driver unit 122_2 through the gate line GL2, and the gate driver unit 122_2 is configured to control the electronic units 140 in the second row. The electronic units 140 in the third row is electrically connected to the gate driver unit 122_3 through the gate line GL3, and the gate driver unit 122_3 is configured to control the electronic units 140 in the third row. The electronic units 140 in the fourth row is electrically connected to the gate driver unit 122_4 through the gate line GL4, and the gate driver unit 122_4 is configured to control the electronic units 140 in the fourth row. The electronic units 140 are disposed on the active region 112 of the substrate 110. Each of the electronic units is a varactor unit. The varactor unit may include elements such as capacitors and/or diodes for adjusting the frequency of electromagnetic waves output and input from the electronic apparatus.

Figure 3A:
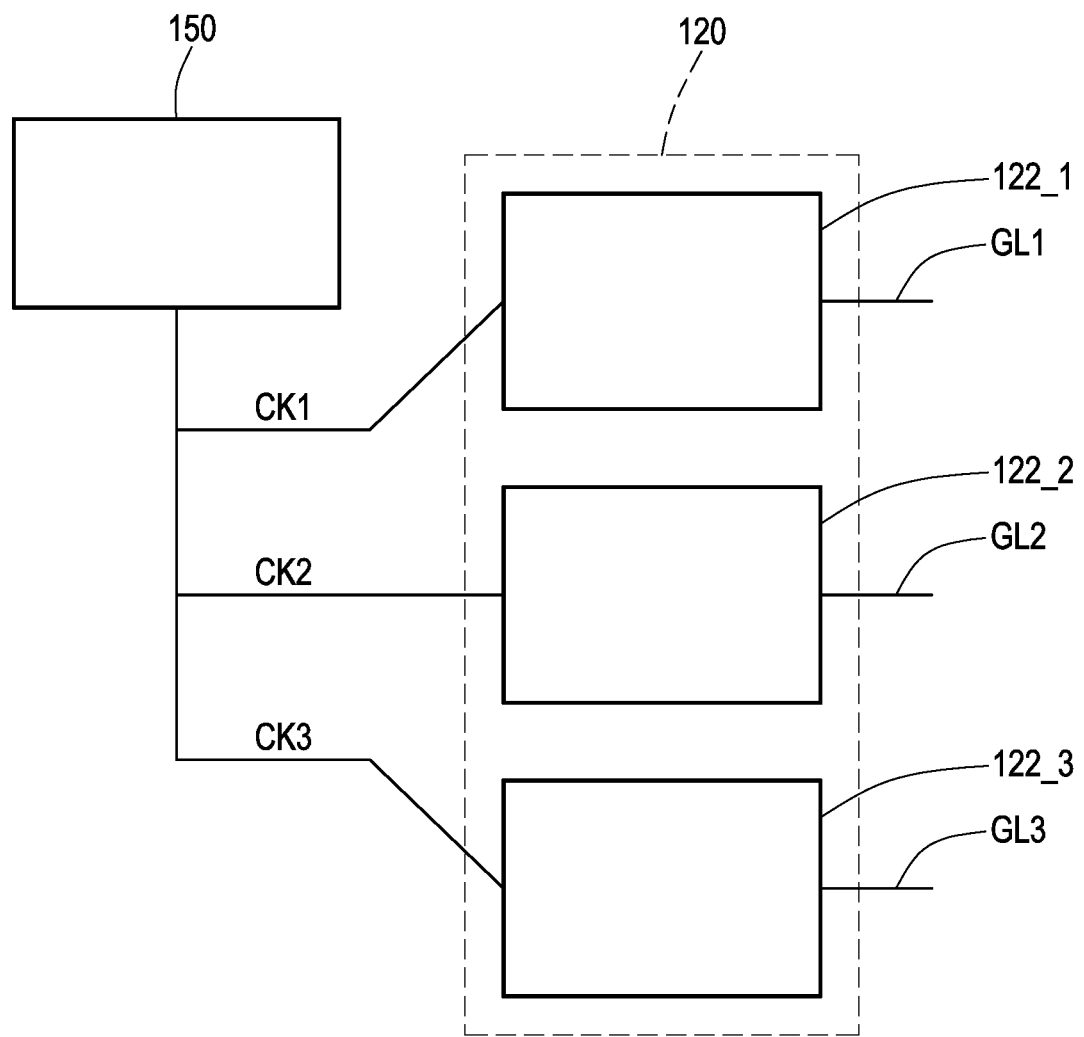
FIG. 3A is a schematic diagram of an electronic apparatus according to another embodiment of this disclosure.

FIG. 3A is a schematic diagram of an electronic apparatus according to another embodiment of this disclosure. Referring to FIG. 3A, the electronic apparatus 100 further includes a synchronization circuit 150. The synchronization circuit 150 is electrically connected to the gate driver units

122_1, 122_2, and 122_3. The synchronization circuit 150 is configured to respectively output the clock signals CK1, CK2, and CK3 to the gate driver units 122_1, 122_2, and 122_3. That is to say, the clock signals of this embodiment include the first clock signal CK1 and the second clock signal CK2. The first gate driver unit 122_1 is configured to receive the first clock signal CK1. The second gate driver unit 122_2 is configured to receive the second clock signal CK2 different from the first clock signal CK1. In this embodiment, the synchronization circuit 150 outputs two or more clock signals CK1, CK2, and CK3 to the gate driver units 122_1, 122_2, and 122_3 to drive the gate lines GL1, GL2, and GL3, so that at least two non-adjacent gate lines among the gate lines GL1, GL2, and GL3 may be turned on at the same time. FIG. 3A is only a schematic diagram, and the gate lines GL1, GL2, and GL3 are, for example, non-adjacent gate lines.

Figure 3B:
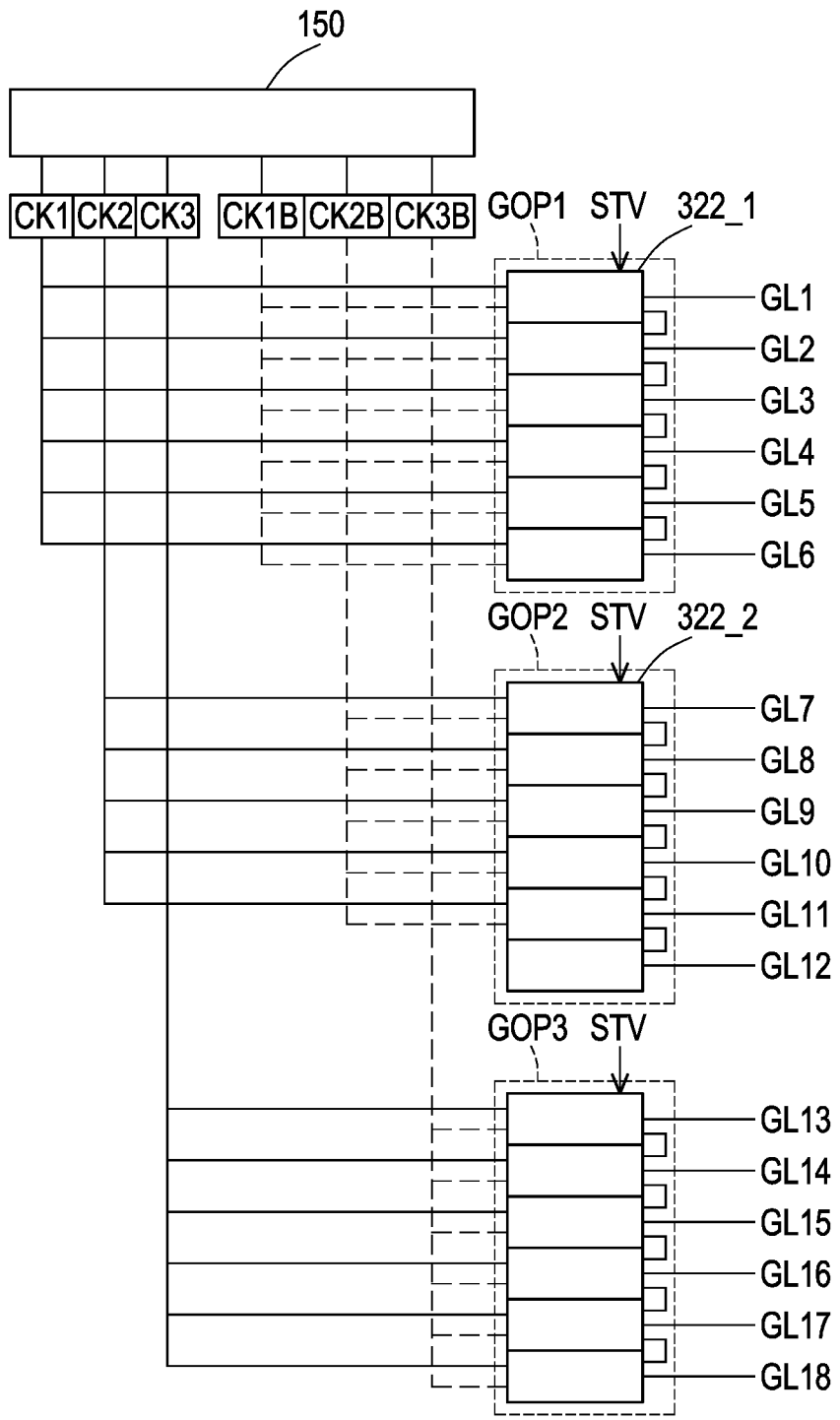
FIG. 3B is a schematic diagram of an electronic apparatus according to another embodiment of this disclosure.

FIG. 3B is a schematic diagram of an electronic apparatus according to another embodiment of this disclosure. Referring to FIG. 3B, the synchronization circuit 150 outputs clock signals CK1, CK2, CK3, CK1B, CK2B, and CK3B. The clock signals CK1, CK2, and CK3 are configured to turn on the corresponding gate lines. The clock signals CK1B, CK2B, and CK3B are configured to turn off the corresponding gate lines. In this embodiment, the electronic apparatus 100 includes multiple gate driver units, for example 18, respectively coupled to the gate lines GL1, GL2, GL3, GL4, GL5, GL6, GL7, GL8, GL9, GL10, GL11, GL12, GL13, GL14, GL15, GL16, GL17, and GL18, the numbers thereof are not configured to limit this disclosure.

The gate driver units are divided into multiple groups GOP1, GOP2, and GOP3. The first gate driver unit 322_1 and the second gate driver unit 322_2 are the first gate driver units of different groups GOP1 and GOP2. The first gate driver unit 322_1 is electrically connected to the first gate line GL1. The second gate driver unit 322_2 is electrically connected to the second gate line GL7. The first gate driver unit 322_1 and the second gate driver unit 322_2 are configured to receive the start signal STV. The start signal STV is configured so that each group starts performing a scanning operation. The first gate line GL1 and the second gate line GL7 transmitted respective gate signals at the same time. The gate lines of the same gate driver unit group are configured to transmit respective gate signals one by one. Take the first driver unit group GOP1 for example, after the gate line GL1 transmitted a gate line signal, the gate line GL2, GL3, GL4, GL5, GL6 transmitted respective gate signals sequentially. The gate signal transmission relationship of the gate lines of the rest gate drive unit groups may be deduced in the same way.

In this embodiment, the number of groups, the number of gate driver units in each group, and the number of clock signals are only configured for illustrative purposes, and are not intended to limit this disclosure. In addition, the wiring layout between the synchronization circuit and the gate driver unit is not configured to limit this disclosure.

Figure 4A:
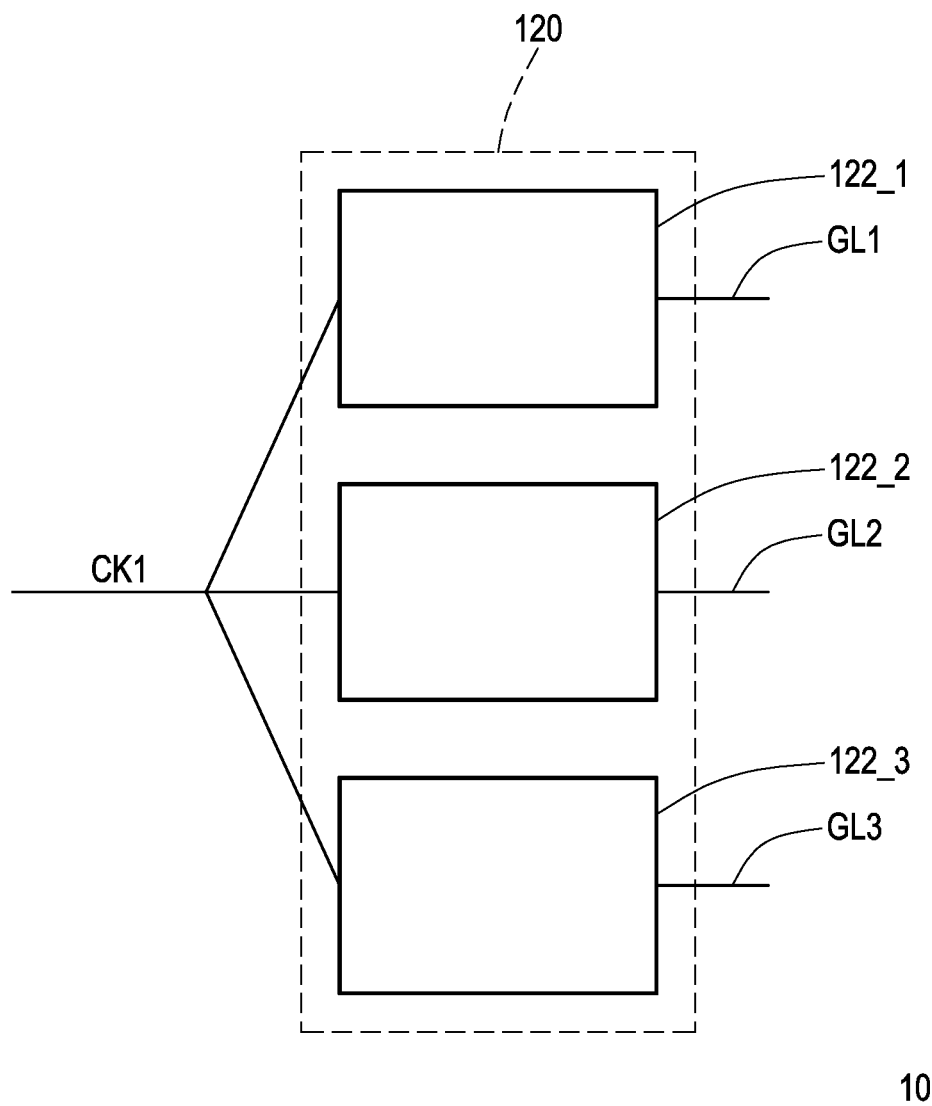
FIG. 4A is a schematic diagram of an electronic apparatus according to another embodiment of this disclosure.

FIG. 4A is a schematic diagram of an electronic apparatus according to another embodiment of this disclosure. Referring to FIG. 3A and FIG. 4A, the electronic apparatus 100 in FIG. 4A is similar to the electronic apparatus 100 in FIG. 3A. The difference between the two is that this embodiment does not require an additional synchronization circuit 150, but connects different gate driver units 122_1, 122_2, and 122_3 through the clock signal CK1, such that multiple driver units are short-circuited. That is to say, the clock signal of this embodiment includes the first clock signal CK1. The first gate driver unit 122_1 and the second gate driver unit 122_2 are configured to receive the same first clock signal CK1. In this embodiment, the clock signal CK1 is output to the gate driver units 122_1, 122_2, and 122_3 to drive the gate lines GL1, GL2, and GL3, so that at least two non-adjacent gate lines among the gate lines GL1, GL2, and GL3 may be turned on at the same time. FIG. 4A is only a schematic diagram, and the gate lines GL1, GL2, and GL3 are, for example, non-adjacent gate lines.

Figure 4B:
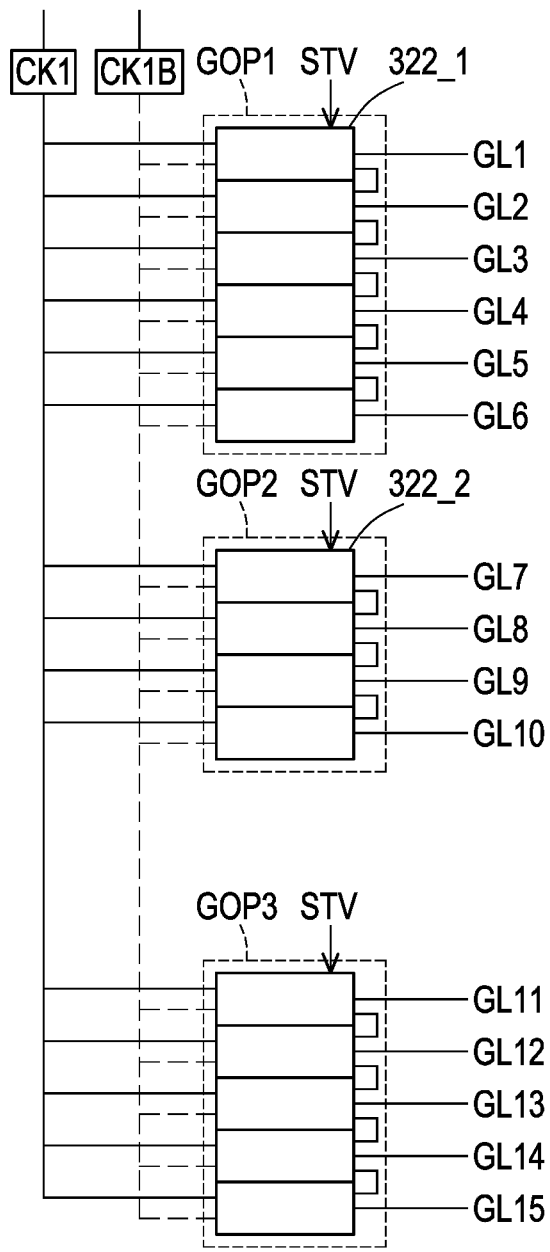
FIG. 4B is a schematic diagram of an electronic apparatus according to another embodiment of this disclosure.

FIG. 4B is a schematic diagram of an electronic apparatus according to another embodiment of this disclosure. Referring to FIG. 4B, a set of clock signals CK1 and CK1B are connected to different gate driver unit groups GOP1, GOP2, and GOP3, so that different driver unit groups are short-circuited. The clock signal CK1 is configured to turn on the corresponding gate line. The clock signal CK1B is configured to turn off the corresponding gate line. In this embodiment, the electronic apparatus 100 includes multiple gate driver units, for example 15, respectively coupled to the gate lines GL1, GL2, GL3, GL4, GL5, GL6, GL7, GL8, GL9, GL10, GL11, GL12, GL13, GL14, and GL15, the numbers thereof are not configured to limit this disclosure. In this embodiment, the number of gate driver units in each group is different. The gate driver units are divided into multiple groups GOP1, GOP2, and GOP3. The first gate driver unit 322_1 and the second gate driver unit 322_2 are the first gate driver units of different groups GOP1 and GOP2. The first gate driver unit 322_1 is electrically connected to the first gate line GL1. The second gate driver unit 322_2 is electrically connected to the second gate line GL7. The first gate driver unit 322_1 and the second gate driver unit 322_2 are configured to receive the start signal STV. The start signal STV is configured so that each group starts performing a scanning operation. The first gate line GL1 and the second gate line GL7 transmitted respective gate signals at the same time. The gate lines of the same gate driver unit group are configured to transmit respective gate signals one by one. Take the second driver unit group GOP2 for example, after the gate line GL7 transmitted a gate line signal, the gate line GL8, GL9, GL10 transmitted respective gate signals sequentially. The gate signal transmission relationship of the gate lines of the rest gate drive unit groups may be deduced in the same way.

Figure 5:
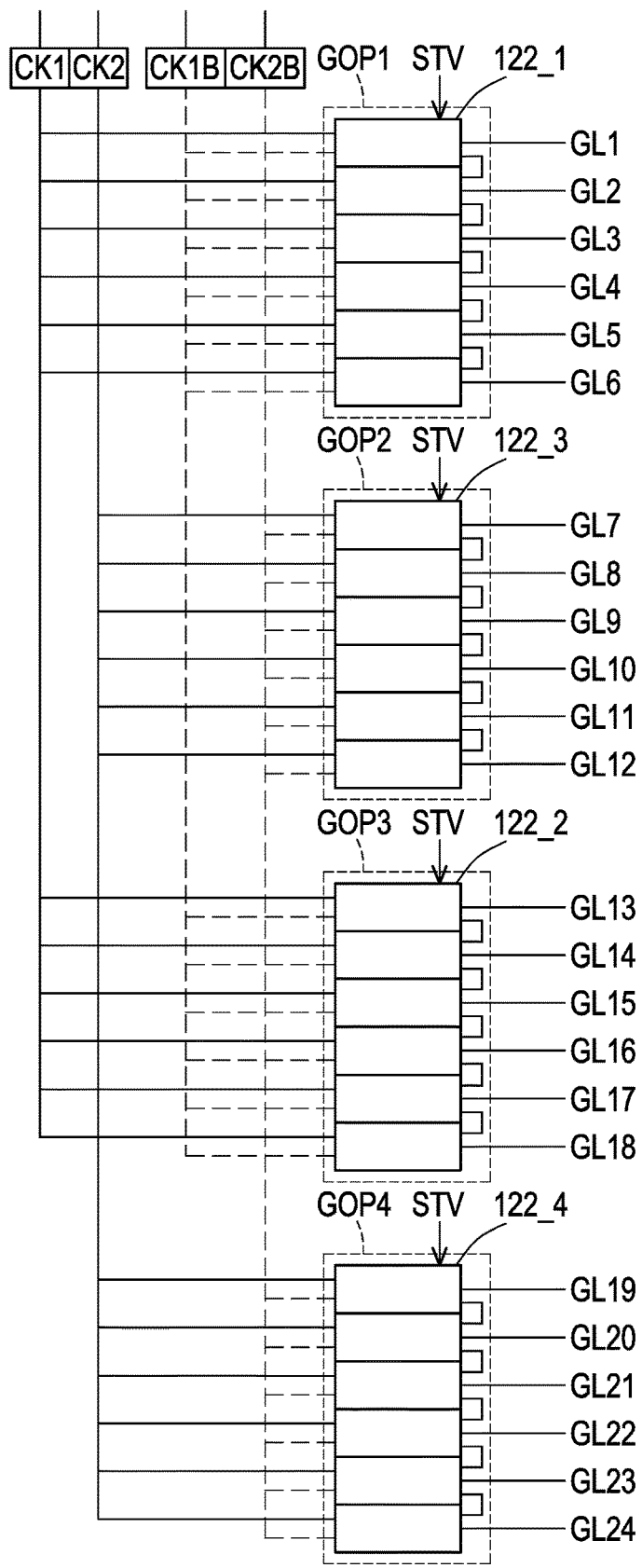
FIG. 5 is a schematic diagram of an electronic apparatus according to another embodiment of this disclosure.

FIG. 5 is a schematic diagram of an electronic apparatus according to another embodiment of this disclosure. Referring to FIG. 5, the synchronization circuit 150 is also not required in this embodiment. This embodiment further shows that there are multiple sets of clock signals (such as clock signals CK1 and CK1B, and clock signals CK2 and CK2B), and each set of clock signals may be short-circuited with non-adjacent gate driver unit groups. For example, the clock signal CK1 is connected to the gate driver unit groups GOP1 and GOP3, and the gate driver unit groups GOP1 and GOP3 are short-circuited together, so the gate line GL1 and the gate line GL13 have the same time sequence. Similarly, the clock signal CK2 is connected to the gate driver unit groups GOP2 and GOP4, and the gate driver unit groups GOP2 and GOP4 are short-circuited together, so the gate line GL7 and the gate line GL19 transmitted respective gate signals at the same time.

Specifically, the clock signals CK1 and CK2 are configured to turn on the corresponding gate lines. The clock signals CK1B and CK2B are configured to turn off the corresponding gate lines. In this embodiment, the electronic apparatus 100 includes multiple gate driver units, for example 24, respectively coupled to the gate lines GL1, GL2, GL3, GL4, GL5, GL6, GL7, GL8, GL9, GL10, GL11, GL12, GL13, GL14, GL15, GL16, GL17, GL18, GL19, GL20, GL21, GL22, GL23, and GL24, the numbers thereof are not configured to limit this disclosure. The gate driver units are divided into multiple groups GOP1, GOP2, GOP3, and GOP4. The first gate line GL1 and the second gate line GL13 transmitted respective gate signals at the same time. In addition, the first gate line GL7 and the second gate line GL19 transmitted a respective gate signal at the same time.

Figure 6A:
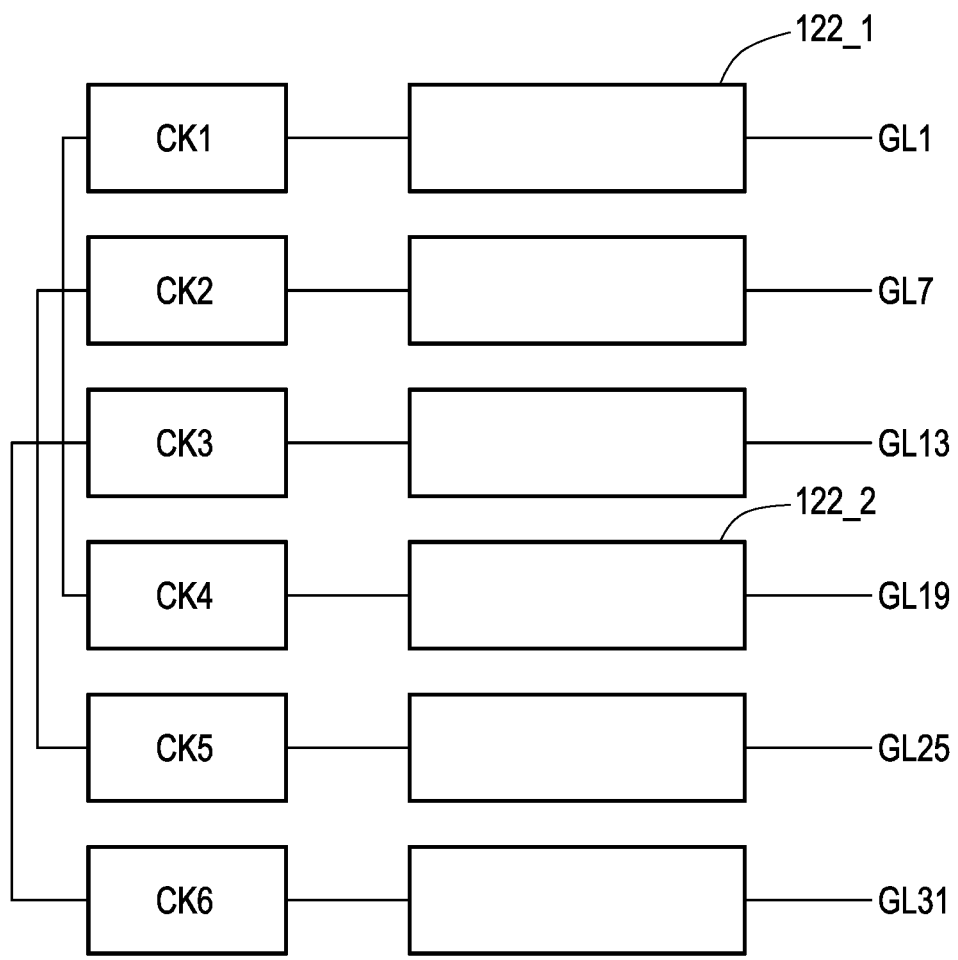
FIG. 6A is a schematic diagram of an electronic apparatus according to another embodiment of this disclosure.

FIG. 6A is a schematic diagram of an electronic apparatus according to another embodiment of this disclosure. Referring to FIG. 6A, the electronic apparatus 100 in FIG. 6A takes 6 clock signals, 6 gate driver units and 6 gate lines as an example, but the numbers thereof are not configured to limit this disclosure. In this embodiment, the transmission paths of the clock signals may be short-circuited so that the respective gate signals transmitted on non-adjacent gate lines have the same time sequence.

For example, the transmission paths of the clock signals CK1 and CK4 may be short-circuited so that the first gate line GL1 and the second gate line GL19 transmitted respective gate signals at the same time, in which the first gate line GL1 and the second gate line GL19 are not adjacent. Similarly, the transmission paths of the clock signals CK2 and CK5 may be short-circuited so that non-adjacent gate lines GL7 and GL25 transmit respective gate signals at the same time; and the transmission paths of the clock signals CK3 and CK6 may be short-circuited so that non-adjacent gate lines GL13 and GL31 transmit respective gate signals at the same time.

Figure 6B:
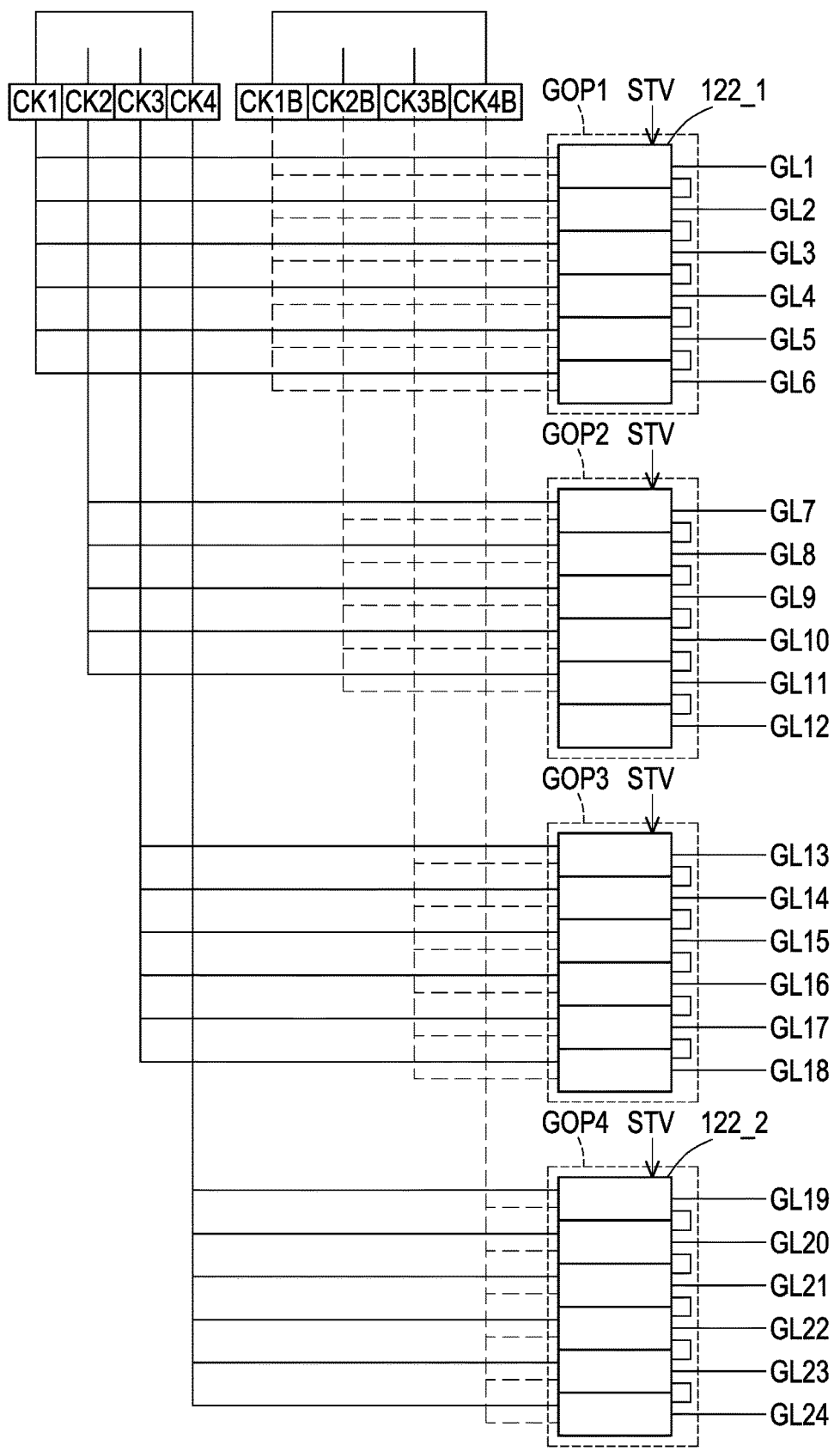
FIG. 6B is a schematic diagram of an electronic apparatus according to another embodiment of this disclosure.

FIG. 6B is a schematic diagram of an electronic apparatus according to another embodiment of this disclosure. Referring to FIG. 6B, in this embodiment, the transmission paths of the clock signals CK1 and CK4 are short-circuited so that non-adjacent gate lines GL1 and GL19 transmit respective gate signals at the same time.

To sum up, in the embodiment of this disclosure, the gate driver unit configured to control the electronic units may be fabricated on the substrate in a lithography process, thereby reducing the yield loss caused by bonding the chip on the substrate, and at the same time, the cost of the product may be reduced because making additional gate driver chips are not required.

Finally, it should be noted that the foregoing embodiments are only used to illustrate the technical solutions of the disclosure, but not to limit the disclosure; although the disclosure has been described in detail with reference to the foregoing embodiments, persons of ordinary skill in the art should understand that the technical solutions described in the foregoing embodiments may still be modified, or parts or all of the technical features thereof can be equivalently replaced; however, these modifications or substitutions do not deviate the essence of the corresponding technical solutions from the scope of the technical solutions of the embodiments of the disclosure.

What is claimed is:

1. An antenna device, comprising:
    a substrate;
    a plurality of gate driver units, disposed on the substrate; and
    a plurality of gate lines, disposed on the substrate, wherein each of the gate lines is respectively electrically connected to a corresponding gate driver unit of the gate driver units, and each of the gate lines is configured to transmit a respective gate signal,
    wherein the plurality of gate lines comprise a first gate line, a second gate line, a third gate line, and a fourth gate line arranged sequentially, the first gate line and the fourth gate line transmit the respective gate signals at a same time, and the first gate line, the second gate line, and the third gate line transmit the respective gate signals at a different time; and
    a plurality of varactor units, disposed on the substrate, wherein each of the first gate line, the second gate line, the third gate line, and the fourth gate line is respectively electrically connected to at least one of the plurality of varactor units, wherein the plurality of varactor units are configured to send and receive electromagnetic wave signals.

2. The antenna device according to claim 1, wherein the varactor units are disposed on the substrate, wherein each of the varactor units is respectively electrically connected to the corresponding gate driver unit of the gate driver units through a corresponding gate line of the gate lines, and each of the gate driver units is configured to control the corresponding varactor unit of the varactor units.

3. The antenna device according to claim 2, wherein the plurality of gate driver units are distributed on a side of the plurality of varactor units.

4. The antenna device according to claim 2, wherein the plurality of gate driver units are distributed on two side of the plurality of varactor units.

5. The antenna device according to claim 1, wherein the varactor unit comprises at least one of a capacitor and a diode.

6. The antenna device according to claim 1, wherein the varactor unit is configured to adjust an electromagnetic wave.

7. The antenna device according to claim 2, wherein the varactor units are disposed on an active region of the substrate.

8. The antenna device according to claim 1, wherein the gate driver units comprises:
    a first gate driver unit, electrically connected to the first gate line; and
    a second gate driver unit, electrically connected to the second gate line,
    wherein the first gate driver unit and the second gate driver unit are configured to receive a start signal.

9. The antenna device according to claim 8, wherein the gate driver units are divided into a plurality of groups comprising a first gate driver unit group and a second gate driver unit group, the first gate driver unit is one of the first gate driver unit group and the second gate driver unit is one of the second gate driver group.

10. The antenna device according to claim 9, wherein the first gate driver unit and the second driver unit are configured to receive the start signal to perform a scanning operation of the first gate driver unit group and the second gate driver unit group.

11. The antenna device according to claim 9, wherein a number of gate driver units number in the first gate driver unit group is different from a number of gate driver units number in the second gate driver unit group.

12. The antenna device according to claim 9, wherein a number of gate driver units number in the first gate driver unit group is identical to a number of gate driver units number in the second gate driver unit group.

13. The antenna device according to claim 8, wherein the first gate driver unit and the second gate driver unit are configured to receive a first clock signal.

14. The antenna device according to claim 8, wherein the first gate driver unit is configured to receive a first clock signal, and the second gate driver unit is configured to receive a second clock signal.

15. The antenna device according to claim 13, wherein transmission paths of the first clock signal and the second clock signal are short-circuited.

16. The antenna device according to claim 1, further comprising:
   a synchronization circuit, electrically connected to the gate driver units and configured to output a clock signal.

17. The antenna device according to claim 1, further comprising a data driver circuit, wherein the data driver circuit is disposed on the substrate.

18. The antenna device according to claim 17, wherein the data driver circuit and the plurality of gate driver units are disposed on a side of the substrate.

* * * * *